(12) United States Patent
Fort

(10) Patent No.: US 8,169,845 B2
(45) Date of Patent: May 1, 2012

(54) APPARATUS AND METHODS FOR SENSE AMPLIFIERS

(75) Inventor: Jimmy Fort, Aix en Provence (FR)

(73) Assignee: Atmel Corporation, San Jose, CA (US)

( * ) Notice: Subject to any disclaimer, the term of this patent is extended or adjusted under 35 U.S.C. 154(b) by 457 days.

(21) Appl. No.: 12/492,027

(22) Filed: Jun. 25, 2009

(65) Prior Publication Data

US 2010/0329059 A1 Dec. 30, 2010

(51) Int. Cl.
*G11C 7/02* (2006.01)
*G11C 7/00* (2006.01)

(52) U.S. Cl. .................................. 365/207; 365/189.11

(58) Field of Classification Search .................. 365/207, 365/189.11, 203
See application file for complete search history.

(56) References Cited

U.S. PATENT DOCUMENTS

| | | | | |
|---|---|---|---|---|
| 6,094,394 A * | 7/2000 | La Rosa | ......................... | 365/207 |
| 6,198,661 B1 * | 3/2001 | Choi et al. | ............... | 365/185.21 |
| 6,466,059 B1 * | 10/2002 | Gaibotti et al. | ................. | 327/53 |
| 6,608,787 B1 | 8/2003 | Daga et al. | | |
| 6,707,717 B2 * | 3/2004 | Jun-Lin | .................... | 365/185.21 |

* cited by examiner

*Primary Examiner* — Anh Phung
(74) *Attorney, Agent, or Firm* — Fish & Richardson P.C.

(57) ABSTRACT

Some embodiments include apparatus and methods having a sense amplifier unit, a supply node to receive a supply voltage, and a line coupled to a memory cell of a device. The sense amplifier unit includes a circuit path coupled between the supply node and the line to carry a current having a value based on a value of information stored in the memory cell; and a second circuit including a second circuit path coupled between the supply node and the line to charge the line during the memory operation. Additional embodiments are disclosed.

20 Claims, 2 Drawing Sheets

APPARATUS AND METHODS FOR SENSE AMPLIFIERS

BACKGROUND

Many electronic products have semiconductor devices, such as processors, microcontrollers, and memory devices. These devices often have numerous memory cells to store data and other information. The information transferred to and from the memory cells is normally represented by electrical signals. Many of these devices usually have sense amplifiers. During retrieval of information from the memory cells, the sense amplifiers sense the signals and amplify them to appropriate values to reflect the values of information stored in the memory cells. These semiconductor devices are often designed to operate at a specific operating supply voltage range. Some applications using these devices may employ a different supply voltage range. Therefore, designing sense amplifiers for some of these applications may become a challenge.

DETAILED DESCRIPTION

Figure 1:
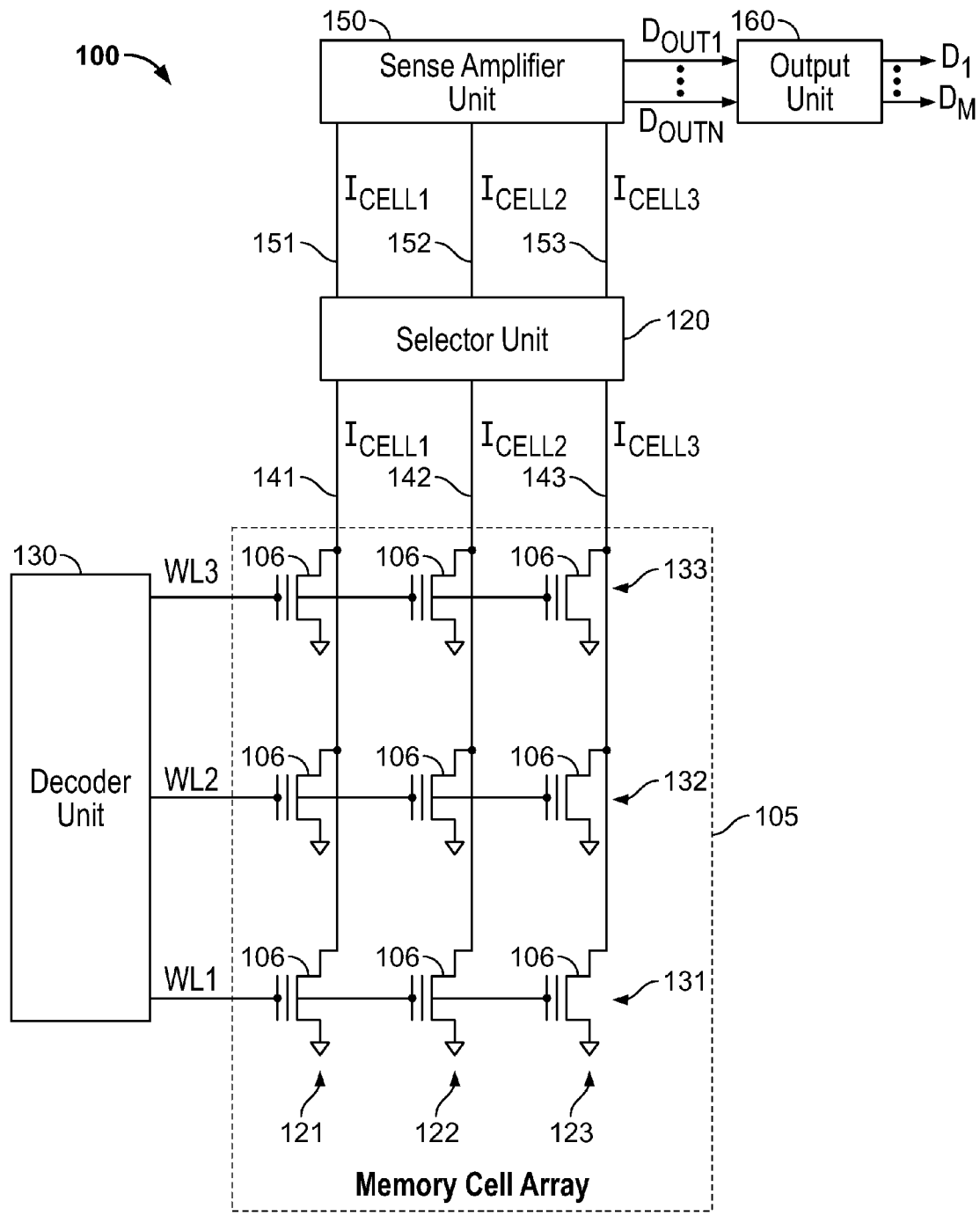
FIG. 1 shows a partial block diagram of a device according to an example embodiment of the invention.

FIG. 1 shows a partial block diagram of an example embodiment of a device 100. Device 100 can be a semiconductor device, such as a processor, a microcontroller, a memory device, or other devices.

Device 100 includes a memory cell array 105 with memory cells 106 arranged in rows 131, 132, and 133 and columns 121, 122, and 123. FIG. 1 shows an example arrangement of memory cells 106 to help focus on the embodiments described herein. Memory cells 106 can be arranged in other arrangements. For example, memory cells 106 can be arranged in a NAND flash memory cell configuration or in a NOR flash memory cell configuration. Moreover, FIG. 1 shows three rows and three columns with three memory cells 106 in each row and each column, as an example. The number of rows, columns, memory cells, and combinations thereof, can vary. Further, FIG. 1 shows memory cells 106 as non-volatile memory cells, such as floating gate transistor memory cells. However, other type of memory cells can be used.

During a memory operation (e.g., a read operation) of device 100, a decoder unit 130 selectively activates signals WL1, WL2, and WL3 to access the memory cells in rows 131, 132, and 133, respectively. A selector unit 120 selectively couples lines 141, 142, 143 to lines 151, 152, and 153, respectively, depending on which of the memory cells 106 is selected. Lines 141, 142, 143, 151, 152, and 153 of device 100 can correspond to bit lines associated with memory cells of a memory device. Device 100 can select memory cell 106 based on information (e.g., address) provided to device 100 from another device, such as from a processor, a memory controller, or a microcontroller. For example, if device 100 selects to retrieve (e.g., read) information from memory cell 106 located at a junction (e.g., address) defined by row 132 and column 122, memory device 100 activates signal WL2 to access the selected memory cell 106. Then, selector unit 120 couples line 142 to line 152, so that the information from the selected memory cell can be retrieved.

The value of current $I_{CELL1}$ during a memory operation is based on a value of information stored in a selected memory cell 106 in column 121. The value of current $I_{CELL2}$ during a memory operation is based on a value of information stored in a selected memory cell 106 in column 122. The value of current $I_{CELL3}$ during a memory operation is based on a value of information stored in a selected memory cell 106 in column 123.

Sense amplifier unit 150 of FIG. 1 operates to sense signals (e.g., currents $I_{CELL1}$, $I_{CELL2}$, and $I_{CELL3}$) on lines 151, 152, and 153 to determine values of information stored in selected memory cells 106. For example, if one of memory cells 106 in column 122 is selected to provide information, then sense amplifier unit 150 senses current $I_{CELL2}$ on line 152 after line 152 is coupled to line 142 by selector unit 120. Based on the value of $I_{CELL2}$, sense amplifier unit 150 provides an output signal, which is one of output signals $D_{OUT1}$ through $D_{OUTN}$, that represents information stored in the selected memory cell 106. An output unit 160 of device 100 can further process signals $D_{OUT1}$ through $D_{OUTN}$ and provide them to other parts (e.g., output terminals or pins) of device 100 as signals $D_1$ through $D_M$. Sense amplifier unit 150 includes a sense amplifier unit described below with reference to FIG. 2.

Figure 2:
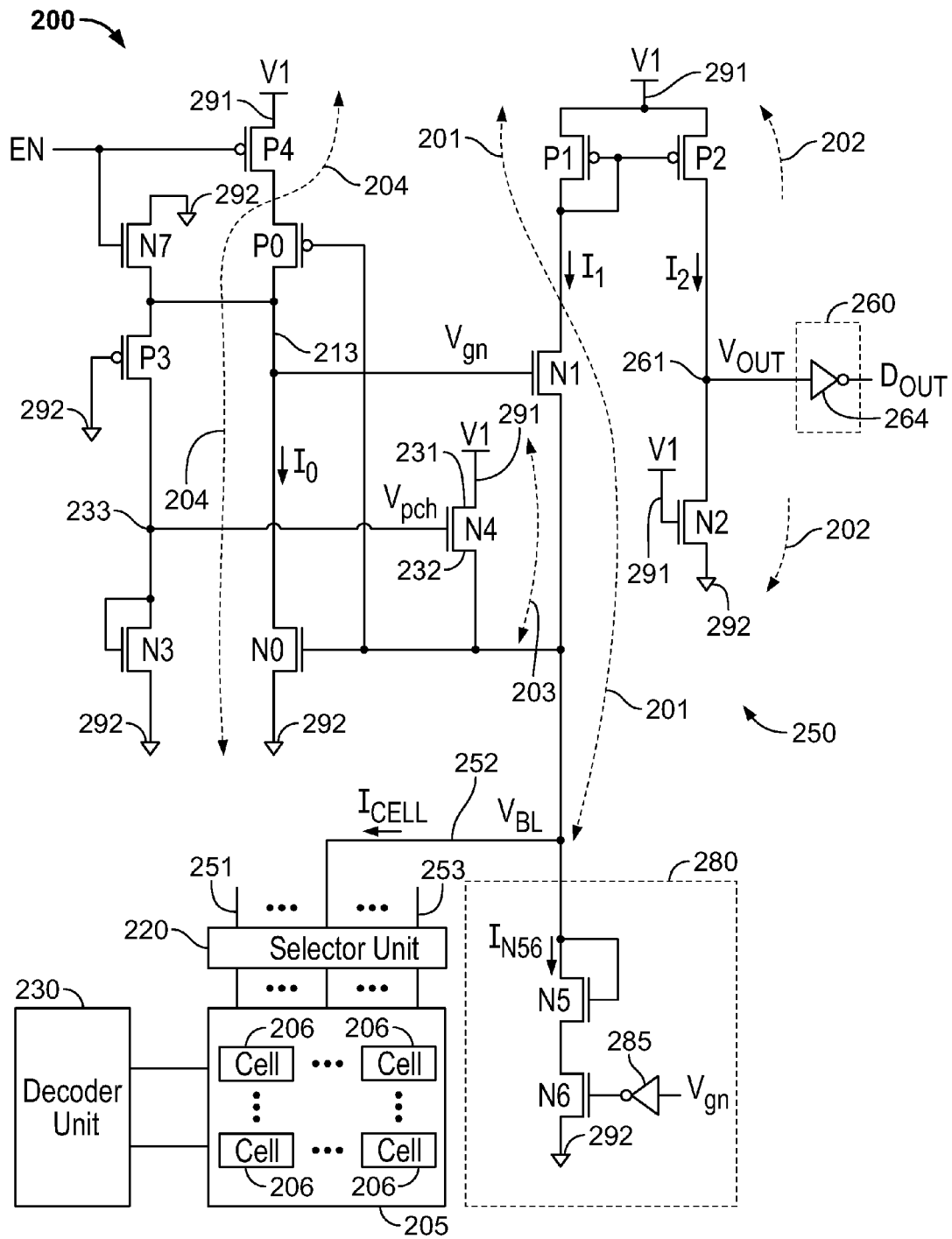
FIG. 2 shows a partial diagram of a device including a sense amplifier unit, according to an example embodiment of the invention.

FIG. 2 shows a partial diagram of an example embodiment of a device 200 including a sense amplifier unit 250. Device 200 includes a memory cell array 205 having memory cells 206, a selector unit 220, and a decoder unit 230; these components can correspond to memory cells 106, selector unit 120, and decoder unit 130 of FIG. 1.

Device 200 also includes lines 251, 252, and 253 to transfer information from memory cells 206. Lines 251, 252, and 253 can correspond to lines 151, 152, and 153, respectively, of FIG. 1. As shown in FIG. 2, line 252 is coupled to sense amplifier unit 250. Lines 251 and 253 are also coupled to other sense amplifier units similar to sense amplifier unit 250. However, for simplicity and to help focus on the embodiments herein, FIG. 2 omits the other sense amplifier units coupled to lines 251 and 253.

As shown in FIG. 2, selector unit 220 is located between lines 251, 252, and 253 and memory cells 206. During a memory operation (e.g., read operation) of device 200, selector unit 220 operates to electrically couple one of lines 251, 252, or 253 to a selected memory cell 206. For example, selector unit 220 can turn on a transistor (not shown) located between a selected memory cell 206 and line 252, so that a current can flow between the selected memory cell 206 and line 252 through the turned-on transistor.

The value of current $I_{CELL}$ carried on line 252 during a memory operation is based on the value of information stored in a selected memory cell 206 coupled to line 252 during the memory operation. For example, if the information stored in a selected memory cell 206 has a first value (e.g., logic 0), then current $I_{CELL}$ can have a first value (e.g., some positive value); if the information stored in the selected memory cell 206 has a second value (e.g., logic 1), then current $I_{CELL}$ can have a second value (e.g., zero or approximately zero).

Sense amplifier unit 250 operates to sense current $I_{CELL}$ and generates an output signal $D_{OUT}$ that has a value based on the value of current $I_{CELL}$. The value of signal $D_{OUT}$ represents the value of information stored in a selected memory cell 206.

Sense amplifier unit 250 includes p-channel metal-oxide-semiconductor (PMOS) transistors P0, P1, P2, P3, and P4; n-channel metal-oxide-semiconductor (NMOS) transistors N0, N1, N2, N3, N4, N5, N6, and N7; an output circuit 260 including an inverter 264; and a circuit 280 including transistors N5 and N6 and an inverter 285. Sense amplifier unit 250 also includes circuit paths 201, 202, 203, and 204.

Circuit path 201 is coupled in series with a supply node 291 and line 252. Voltage V1 can be a supply voltage (e.g., VDD or VCC) that device 200 uses to operate. Voltage V1 can have a range from approximately 1.3 volts to approximately 3.6 volts. Other ranges can be used. During a memory operation, circuit path 201 carries a current $I_1$. $I_1 = I_{CELL} + I_{N56}$. $I_{N56}$ is a current flowing through transistors N5 and N6. As described in more detail below, the value of $I_{N56}$ is normally zero during a memory operation because transistor N6 is normal turned off in a memory operation. Therefore, current $I_1$ is equal to or approximately equal to current $I_{CELL}$. As described above, since sense amplifier unit 250 generates an output signal $D_{OUT}$ based on current $I_{CELL}$, sensing current $I_{CELL}$ to generate output signal $D_{OUT}$ is equivalent to sensing current $I_1$ to generate output signal $D_{OUT}$.

Circuit path 202 includes transistors P2 and N2 coupled between supply nodes 291 and 292. Circuit paths 201 and 202 are arranged in a configuration as shown in FIG. 2 to copy current $I_1$ from circuit path 201 to generate a current $I_2$ on circuit path 202.

Output circuit 260 generates output signal $D_{OUT}$ based on a voltage $V_{OUT}$ at circuit node 261. For example, output signal $D_{OUT}$ has a first value (e.g., logic 0) when the value of voltage $V_{OUT}$ is at least equal to a trip point of inverter 264 and a second value (e.g., logic 1) when the value of voltage $V_{OUT}$ is less than the trip point of inverter 264.

Circuit path 203 is coupled between supply node 291 and line 252. As shown in FIG. 2, circuit path 203 includes only one transistor N4 located therein. During a memory operation, in addition to charging line 252 to a voltage via circuit path 201, sense amplifier unit 250 also charges line 252 to the voltage via circuit path 203, before sense amplifier unit 250 senses current $I_{CELL}$ to generate output signal $D_{OUT}$. Transistor N4 includes a node 231 (e.g., drain) directly coupled to supply node 291, a node 232 (e.g., source) directly coupled to line 252, and a gate responsive to a voltage coupled to a circuit node 233 to receive a voltage Vpch. In the description herein, "directly coupled" means a direct connection between two circuit elements without going though a third circuit element, such as through a transistor, a capacitor, or a resistor.

Circuit path 204 includes transistors P0, P4, and N0 coupled between supply nodes 291 and 292. Transistors P0 and N0 form an inverting amplifier stage to maintain a voltage $V_{BL}$ on line 252 at a value (e.g., clamped value) when line 252 is charged during a memory operation. Circuit path 204 also has a current $I_0$ flowing through node 213 between transistors P0 and N0.

Transistors P3 and N3 are coupled in series between supply nodes 291 and 292. Supply node 292 can have a voltage of zero volts or a ground potential. Transistors P3 and N3 form a circuit to control the value of voltage Vpch, such that an offset voltage (a voltage difference) between voltages Vpch and Vgn can be substantially independent of current $I_0$ and independent of the value the supply voltage (e.g., V1) of device 200. Transistors P3 and N3 control voltage Vpch such that the value of voltage Vpch is independent of current $I_0$ on circuit path 204. This enables sense amplifier unit 250 to sufficiently turn off transistor N4 after voltage $V_{BL}$ reaches a value (e.g., approximately 0.7 volt) during charging of line 252 through circuit paths 201 and 203.

Circuit 280 creates a path from line 252 to supply node 292 to discharge unexpected overshoot (e.g., positive glitch) on line 252. As described above, transistor N6 is normally turned off. However, if an unexpected overshoot occurs on line 252, transistor N6 is turned on path from line 252 to supply node 292. For example, when a positive glitch occurs on line 252, voltage Vgn at node 213 (and also at the input of inverter 285) goes to a value, e.g., a value at node 292, that switches inverter 285 from one state to another state to turn on transistor N6. The positive glitch on line 252 can discharge to supply node 292 through the path created by transistors N5 and N6.

Device 200 uses a signal EN to turn on or off sense amplifier unit 250, depending on the modes of device 200. For example, in one mode (e.g., data transfer mode) device 200 asserts one value to the EN signal to turn off transistor N7 and turn on transistor P4, so that sense amplifier unit 250 is turned on. In another example, in another mode (e.g., standby mode), device 200 asserts another value to the EN signal to turn on transistor N7 and turn off transistor P4, so that sense amplifier unit 250 is turned off and no DC current is flowing in sense amplifier unit 250.

A memory operation of device 200 to generate output signal $D_{OUT}$ to represent a value of a select memory cell 206 can include a precharge function, a sensing function, and an output function. Sense amplifier unit 250 performs the precharge function during a first time interval of a memory operation to charge line 252, such that the value of voltage $V_{BL}$ can reach an expected (e.g., clamped) value. Sense amplifier unit 250 performs the sensing function during a second time interval after the first time interval of a memory operation to generate current $I_1$ on circuit path 201 based on current $I_{CELL}$. Sense amplifier unit 250 performs the output function after the sensing operation to generate output signal $D_{OUT}$ based on current $I_1$.

In a precharge function, sense amplifier unit 250 charges (or precharges) line 252 and maintains a stable voltage on line 252. Voltage $V_{BL}$ is the voltage on line 252. To limit cycling degradation of memory cells 206 in memory operations, such as read operations, sense amplifier unit 250 can charge line 252 during the precharge operation, such that voltage $V_{BL}$ has an expected value less than a value of voltage V1 at supply node 291. For example, voltage $V_{BL}$ can have a value of approximately 0.7 volt when the supply voltage (e.g., V1) of device 200 is approximately 3 volts when line 252 is charged during a precharge function of sense amplifier unit 250.

Transistors P0, N0, and N1 form a current-current feedback loop. During a memory operation, the current-current feedback loop can maintain a stable voltage on line 252 uncorrelated to current $I_{CELL}$. At the beginning of a precharge operation, voltage $V_{BL}$ on line 252 can be approximately zero. Device 200 asserts a value to signal EN to turn off transistor N7 and turn on transistor P4. Current $I_0$ flows on circuit path 204. Voltage Vgn increases and turns on transistor N1. Line 252 is electrically coupled node to 291 through transistors N1 and P1. Current $I_1$ flows on circuit path 201 through transistors N1 and P1. Thus, line 252 is charged to supply node 291 through transistors N1 and P1 of circuit path 201. However, at the beginning of the memory operation, current $I_1$ may be insufficient to quickly charge line 252 to an expected value (e.g., 0.7 volt) within a specified time. The specified time includes a time interval where voltage $V_{BL}$ on line 252 is expected to reach an expected value before a selected memory cell 206 is electrically coupled to line 252 for a sensing function.

Transistors P3, N3, and N4 form a circuit to quickly charge line 252 to an expected value during a precharge function to improve the precharge function, such as to increase the precharge speed. In the precharge function, voltage Vpch increases and turns on transistor N4. Line 252 is electrically coupled to supply node 291 through transistor N4. Thus, during the precharge function, line 252 is electrically coupled to supply node 291 through transistors N1 and P1 of circuit path 201 and through transistor N4 of circuit path 203. Transistor N4 can be configured such that it can drive enough current to set the value of voltage $V_{BL}$ on line 252 to an expected voltage (e.g., 0.7 volt) within the specified time.

The sizing of transistors N0 and P0 determine a value (e.g., 0.7 volt) at which voltage $V_{BL}$ is maintained (e.g., clamped) during the precharge function. When the value of voltage $V_{BL}$ on line 252 reaches the trip point of the inverting amplifier stage formed by transistors P0 and N0, a common stage formed by transistors P3 and N3 creates an offset voltage (e.g., 150 millivolts) between Vgn and Vpch. As shown in FIG. 2, the gate of transistor N1 at node 213 is directly coupled to a drain of transistor P3, and the gate of transistor N4 at node 233 is directly coupled to a source of transistor P3. Thus, the gates of transistors N1 and N4 are coupled to each other through the drain (at node 213) and the source (at node 233) of transistor P3. Therefore, the offset voltage between voltages Vgn and Vpch at nodes 213 and 233, respectively, is approximately equal to the drain to source voltage ($Vds_{P3}$) of transistor P3. As a result, transistor N4 is turned off. Transistor N1 remains turned on. Thus, almost all of the current between supply node 291 and line 252 flows through transistor N1.

The drain to source voltage ($Vds_{P3}$) of transistor P3 is substantially independent of current $I_0$ and independent of the value of the supply voltage (e.g., V1) of device 200. Therefore, transistor N4 can be sufficiently turned off at the end of the precharge function to improve the sensing function that occurs after the precharge function. Further, in sense amplifier unit 250 of FIG. 2, since circuit path 203 has only one transistor N4, and since the transistor N4 can be sufficiently turned off at the end of the precharge function, as described above, sense amplifier unit 250 can operate at a relative lower supply voltage and maintain a proper precharge function.

In a sensing function, which is after the precharge function described above, current $I_{CELL}$ associated with a selected memory cell 206 flows on line 252 after the selected memory cell 206 is accessed and coupled to line 252. Transistor N1 remains turned on by voltage Vgn. The value of current $I_1$ flowing through the transistor N1 is approximately equal to the value of current $I_{CELL}$ on line 252, attributed to the current-current feedback loop formed by transistors P0, N0 and N1.

Sense amplifier unit 250 copies current $I_1$ and generates current $I_2$ on circuit path 202. Transistors P1 and P2 form a current mirror to copy current $I_1$ and generate current $I_2$. $I_2=nI_1$, where "n" is the ratio between the sizes of transistors P1 and P2. Current $I_2$ is converted into a voltage Vout with a load formed by transistor N2. The current trip point of sense amplifier unit 250 occurs when voltage $V_{OUT}$ reaches the trip point of inverter 264. This current trip point of sense amplifier unit 250 can be adjusted by adjusting the sizing of transistor N2, the sizing of the inverter 264, and the ratio between the sizes of transistors P1 and P2.

In an output function, output circuit 260 generates output signal $D_{OUT}$ based on voltage $V_{OUT}$, which in turn is based on the value of current $I_2$. For example, output circuit 260 generates output signal $D_{OUT}$ with a first value (e.g., logic 0) when $I_2$ has a value (e.g., some positive value) that causes the value of voltage $V_{OUT}$ to be at least equal to the trip point of inverter 264 to turn on inverter 264, thereby providing $D_{OUT}$ with the first value. In another example, output circuit 260 generates output signal $D_{OUT}$ with a second value (e.g., logic 1) when $I_2$ has a value (e.g., zero or approximately zero) that causes the value of voltage $V_{OUT}$ to be less than the trip point of inverter 264. Thus, inverter 264 remains off (or turned off), thereby providing $D_{OUT}$ with the second value.

The above description describes sense amplifier unit 250 generating a singled-ended output signal ($D_{OUT}$). However, sense amplifier unit 250 can also be used as a part of a differential circuit to generate differential signals.

The above functions of sense amplifier unit 250 are influenced by the values of voltages $V_{BL}$ and Vpch; the current trip point; and switching time and power. The following description describes a DC modeling for voltages $V_{BL}$ and Vpch calculation; the current trip point calculation; and the switching time and power calculation.

A first order modeling for voltages $V_{BL}$ and Vpch calculation is as follows. Transistors (e.g., P0, N0, and N1) of the current-current feedback loop can be configured to operate in saturation region. Thus, the inverting amplifier stage formed by transistors P0 and N0 can have a high gain and can determine the value for voltage $V_{BL}$ as follows.

$$V_{BL} \approx V_{th(P0,N0)}$$

In the expression above, $V_{th(P0,N0)}$ is the threshold voltage of the inverting amplifier stage formed by transistors P0 and N0. The variations in values of voltage $V_{BL}$ on line 252 in the function of current $I_{CELL}$ is given by:

$$\Delta V_{BL} \approx \frac{1}{-A \cdot gm_{N1}} \Delta I_{CELL}$$

In the expression above, "–A" is the gain of the amplifier formed by transistors P0 and N0 and $gm_{N1}$ is the transconductance of the transistor N1. Line 252 can have a very low impedance, attributed to the current-current feedback loop formed by transistors P0, N0, and N1. Thus, from the above expression, voltage $V_{BL}$ on line 252 can have few variations in the function of current $I_{CELL}$. Therefore, during sensing function, device 200 can avoid memory cell current (e.g., $I_{CELL}$) variations since voltage $V_{BL}$ can have few variations.

At the end of the precharge function, transistor N4 can be turned off, so that it does not derive current from transistor N1 during the sensing function after the precharge function. As shown in FIG. 2, transistor N4 can be turned on or off by controlling the value of voltage Vpch, which also depends in part on the value of voltage Vgn. Thus, during the sensing function, by controlling the offset voltage between voltages Vgn and Vpch, transistor N4 can be turned off while transistor N1 can remain turned on. The relationship between voltages Vgn and Vpch is given below.

$$Vpch = Vgn - Vds_{P3}$$

In the above equation, $Vds_{P3}$ is the drain to source voltage of transistor P3 and is determined by the sizing of transistor P3. For example, $Vds_{P3}$ can be approximately 150 millivolts. Voltage Vgn depends on current $I_{CELL}$ and can fluctuate. Thus, to keep $Vds_{P3}$ constant, voltage Vpch can be set to follow voltage Vgn:

$$\Delta Vgn = -A \cdot \Delta V_{BL} \approx \frac{1}{gm_{N1}} \Delta V_{CELL}$$

$$\Delta Vpch = \frac{gm_{P3}}{gm_{N3}} \Delta Vgn \approx \Delta Vgn,$$

if $gm_{P3}=gm_{N3}$ (the transconductance of transistors P3 and N3, respectively).

A first order modeling for the current trip point calculation is as follows. Sense amplifier unit 250 switches the value of output signal $D_{OUT}$ from one value (e.g., logic 1) to another value (e.g., logic 0) when voltage Vout reaches the trip point ($V_{th,INV}$) of inverter 264. When voltage Vout varies from zero volts to $V_{th,INV}$, transistor N2 operated in linear mode, acting as a resistor with an effective resistance $R_{N2}$. The condition to determine the threshold of current $I_{CELL}$ ($I_{th,cell}$) is as follows.

$$R_{N2}nI_{th,cell} = V_{th,INV}, \text{ where } R_{N2} = \frac{1}{\mu Cox\left(\frac{W}{L}\right)_{N2}(V_1 - V_{N2})},$$

giving the following expression for $I_{th,cell}$:

$$I_{th,cell} = \frac{1}{n}\mu Cox\left(\frac{W}{L}\right)_{N2}(V_{V1} - V_{N2})V_{th,INV},$$

where "n" is the ratio between the sizes of transistors P1 and P2. μCox, (W/L)$_{N2}$, and $V_{N2}$ are, respectively, the process transconductance parameter, the ratio between channel length and width, and the threshold voltage of transistor N2. The above expression exhibits a linear variation with respect to voltage V1 (e.g., supply voltage of device 200 of FIG. 2). As the mobility μ and threshold voltage $V_{N2}$ of transistor N2 decrease with temperature, a compensation of $I_{th,cell}$ with temperature is expected but the mobility variation is dominant. Further, based on the above expression, the current trip point can be adjusted by tuning the value for "n" (ratio between the sizes of transistors P1 and P2) and the sizing of transistor N2.

A first order modeling for switching time and power calculation is as follows. Both falling delay and rising delay associated with reading of a selected memory cell 206 are considered for the dynamic analysis. The falling delay is associated with the reading of a selected memory cell 206, such that $I_{CELL}>I_{th,cell}$. The rising delay is associated with the reading of a selected memory cell 206, such that $I_{CELL}<I_{th,cell}$. The total switching delay can be divided into four contributions: the precharge delay, the time necessary to start the current mirror formed by transistors P1 and P2, the time to charge/discharge node 261 (voltage Vout), and the time to charge/discharge the node having output signal Dout. For reasonable multiplication factor values (e.g., n<3), the current mirror (formed by transistors P1 and P2) starting time can be negligible. If voltage Vout is assumed to be the output of the sense amplifier unit 250, the delay in inverter 264 is also negligible.

When reading a selected memory cell 206 that has a state corresponding to $I_{CELL}>I_{th,cell}$ (e.g., an "ON" state memory cell), node 261 is charged through current $nI_{CELL}-I_{N2}$, such that the value of voltage Vout increases. $I_{N2}$ is the current flowing through transistor N2. A delay $T_{rdON}$ when reading a selected memory cell 206 that has a state corresponding to $I_{CELL}>I_{th,cell}$ can be written as:

$$T_{rdON} \approx t_{precharge} + (C_{INV} + C_{DN2} + C_{DP2})\frac{V_{th,INV}}{nI_{CELL} - I_{N2}}$$

In the above expression, $t_{precharge}$ is the precharge delay that can be adjusted by sizing transistors P0 and N0, $C_{INV}$ is the input capacitance of inverter 264, $C_{DN2}$ is the drain capacitance of transistor N2, and $C_{DP2}$ is the drain capacitance of transistor P2.

When reading a selected memory cell 206 that has a state corresponding to $I_{CELL}<I_{th,cell}$ (e.g., an "OFF" state memory cell), node 261 is discharged through current $I_{N2}$ through transistor N2, such that the value of voltage Vout at node 261 decreases. A delay $T_{rdOFF}$ when reading a selected memory cell 206 that has a state corresponding to $I_{CELL}<I_{th,cell}$ can be written as:

$$T_{rdOFF} \approx t_{precharge} + (C_{INV} + C_{DN2} + C_{DP2})\frac{V_1 - V_{th,INV}}{I_{N2}}$$

The above equations of $T_{rdON}$ and $T_{rdOFF}$ give indications on how sense amplifier unit 250 can be configured (e.g., sized). For example, "n" (the ratio between the sizes of transistors P1 and P2) and the sizing of the transistor N2 can be adjusted in order to meet the trip point target. The dimensions of inverter 264 can be decreased in order to minimize the capacitance $C_{INV}$ on node 261 and can be a sized to reach $V_{th,INV}$ at approximately one half of the supply voltage (e.g., one half of V1) of device 200.

One or more embodiments described herein include apparatus and methods having a sense amplifier unit, a supply node to receive a supply voltage, and a line coupled to a memory cell of a device. The sense amplifier unit includes a circuit path coupled between the supply node and the line to carry a current having a value based on a value of information stored in the memory cell; and a second circuit including a second circuit path coupled between the supply node and the line to charge the line during the memory operation. Other embodiments, including additional apparatus and methods, are described above with reference to FIG. 1 and FIG. 2.

The illustrations of the apparatus, such as devices 100 and 200 and their associated components, are intended to provide a general understanding of the structure of various embodiments and not a complete description of all the elements and features of the apparatus that might make use of the structures described herein.

Any of the components described above can be implemented in a number of ways, including simulation via software. Thus, the apparatus (e.g., devices 100 and 200) and their associated components described above can all be characterized as "modules" (or "module") herein. Such modules may include hardware circuitry, single and/or multi-processor circuits, memory circuits, software program modules and objects and/or firmware, and combinations thereof, as desired by the architect of the apparatus (e.g., devices 100 and 200), and as appropriate for particular implementations of various embodiments. For example, such modules may be included in a system operation simulation package, such as a software electrical signal simulation package, a power usage and distribution simulation package, a capacitance-inductance simulation package, a power/heat dissipation simulation package, a signal transmission-reception simulation package, and/or a combination of software and hardware used to operate or simulate the operation of various potential embodiments.

The apparatus of various embodiments includes or can be included in electronic circuitry used in high-speed computers, communication and signal processing circuitry, memory modules, portable memory storage devices (e.g., thumb drives), single or multi-processor modules, single or multiple embedded processors, multi-core processors, data switches, and application-specific modules including multilayer and multi-chip modules. Such apparatus may further be included as sub-components within a variety of electronic systems such as televisions, memory cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Portions and features of some embodiments may be included in, or substituted for, those of others. Other embodiments will be apparent to those of skill in the art upon reading and understanding the above description.

The Abstract is provided to comply with 37 C.F.R. §1.72(b) and is submitted with the understanding that it will not be used to interpret or limit the scope or meaning of the claims.

What is claimed is:

1. An apparatus comprising:
    a supply node;
    a line coupled to a memory cell of a device;
    a first circuit including a first circuit path coupled between the supply node and the line to carry a current during a memory operation of the device, the current having a value based on a value of information stored in the memory cell, the first circuit path including a first transistor with a first gate;
    a second circuit including a second circuit path coupled between the supply node and the line to charge the line during the memory operation, the second circuit path including a second transistor with a second gate; and
    a third transistor coupled between the first gate and the second gate.

2. The apparatus of claim 1, wherein the third transistor is configured such that a voltage at the second gate is a function of a voltage at the first gate and a drain to source voltage of the third transistor.

3. The apparatus of claim 1, wherein the second transistor includes a first node directly coupled to the supply node and a second node directly coupled to the line.

4. The apparatus of claim 3, wherein the third transistor includes a first node directly coupled to the first gate and a second node directly coupled to the second gate.

5. An apparatus comprising:
    a supply node;
    a line coupled to a memory cell of a device;
    a first circuit path to carry a current during a memory operation of the device, the current having a value based on a value of information stored in the memory cell, the first circuit path configured to electrically couple the line to the supply node during the memory operation;
    a second circuit path to electrically couple the line to the supply node during the memory operation to change a value of a voltage on the line, the second circuit path including a transistor coupled between the supply node and the line;
    a third circuit path arranged with the first circuit path to maintain a voltage on the line; and
    a circuit coupled to a gate of the transistor to apply a voltage having a value independent of a value of a current on the third circuit path to turn off the transistor when the value of the voltage on the line is changed from a first value to a second value.

6. The apparatus of claim 5, wherein the second circuit path includes only one transistor between the line and the supply node.

7. The apparatus of claim 5, wherein the third circuit path includes a first transistor and a second transistor, the second transistor arranged with the first transistor to form an inverting amplifier stage such that the inverting amplifier stage is configured to include a trip point having a value equal to the second value of the voltage on the line.

8. The apparatus of claim 5, wherein the third circuit path includes a first transistor and a second transistor coupled between the supply node and an additional supply node and the first and second transistors configured to enable the current on the third circuit path to flow through a node between the first and second transistors.

9. The apparatus of claim 8, wherein each of the first and second transistors includes a gate coupled to the line.

10. The apparatus of claim 8, wherein the circuit includes a third transistor coupled between a gate of the transistor of the second circuit path and the node between the first and second transistors of the third circuit path.

11. The apparatus of claim 10, wherein the first circuit path includes a fourth transistor having a gate coupled to the node between the first and second transistors of the third circuit path.

12. An apparatus comprising:
    a first supply node;
    a line coupled to a memory cell;
    an inverting stage including an input coupled to the line;
    a first transistor coupled between the supply node and the line, the first transistor including a gate coupled to an output of the inverting stage;
    a second transistor coupled between the supply node and the line;
    a third transistor including a first node coupled to a gate of the second transistor, a second node coupled to an output of the inverting stage, and a gate coupled to a second supply node; and
    a fourth transistor coupled between the first node of the third transistor and the second supply node.

13. The apparatus of claim 12, wherein the inverting stage includes:
    a fifth transistor coupled between the gate of the first transistor and the first supply node; and
    a sixth transistor coupled between the gate of the first transistor and the second supply node.

14. The apparatus of claim 12 further comprising:
    a fifth transistor including a first node coupled to the first transistor, a second node coupled to the first supply node, and a gate coupled to the first node;
    a sixth transistor including a gate coupled to the gate of the fifth transistor, a first node coupled to the first supply node, and a second node coupled to a circuit node; and
    a seventh transistor including a first node coupled to the circuit node, a second node coupled to the second supply node, and a gate coupled to the first supply node.

15. The apparatus of claim 12 further comprising:
a fifth transistor and a sixth transistor, the sixth transistor coupled in series with the fifth transistor between the line and the second supply node; and
an inverter including an output coupled to the gate of the sixth transistor and an input coupled to the gate of the first transistor.

16. A method comprising:
electrically coupling a line to a supply node through a first transistor of a first circuit path to access information stored in a memory cell of a device, wherein electrically coupling the line includes applying a first voltage from a node of a circuit path to a gate of the first transistor;
electrically coupling the line to the supply node through a second transistor of a second circuit path during the memory operation; and
turning off the second transistor, wherein turning off includes applying a second voltage from a circuit to a gate of the second transistor, and wherein a value of the second voltage is independent of a value of a current on the circuit path.

17. The method of claim 16, wherein electrically coupling the line to the supply node through the first transistor includes keeping the first transistor turned on when the second transistor is turned off.

18. The method of claim 16, wherein applying the first voltage and applying the second voltage include creating a voltage difference between the first and second voltages, such that the voltage difference is a function of a drain to source of a transistor of the circuit.

19. The method of claim 16, wherein electrically coupling the line to the supply node through the second transistor includes electrically coupling a first node of the second transistor directly to the supply node, and electrically coupling a second node of the second transistor directly to the line.

20. The method of claim 16 further comprising:
copying a first current on the first circuit path to generate a second current; and
generating an output signal to represent a value of the information stored in the memory cell, wherein a value of output signal is based on the value of the second current.

\* \* \* \* \*